United States Patent
Hattori et al.

[11] Patent Number: 5,221,450
[45] Date of Patent: Jun. 22, 1993

[54] ELECTROSTATIC CHUCKING METHOD

[75] Inventors: Kei Hattori; Makoto Sekine, both of Yokohama, Japan

[73] Assignee: Kabushiki Kaisha Toshiba, Kawasaki, Japan

[21] Appl. No.: 741,080

[22] Filed: Aug. 6, 1991

[30] Foreign Application Priority Data

Aug. 7, 1990 [JP] Japan .................................. 2-207551

[51] Int. Cl.$^5$ .................................................. C23F 4/04
[52] U.S. Cl. ............................ 204/192.32; 204/298.15; 204/298.31; 156/643
[58] Field of Search ................... 204/192.32, 192.35, 204/298.09, 298.15, 298.31; 156/345, 643

[56] References Cited

U.S. PATENT DOCUMENTS

| 4,384,918 | 5/1983 | Abe ...................................... 156/643 |
| 4,399,016 | 8/1983 | Tsukada et al. ...................... 156/643 |
| 5,092,729 | 3/1992 | Yamazaki et al. ................... 414/225 |

FOREIGN PATENT DOCUMENTS

| 0260150 | 3/1988 | European Pat. Off. ........ 204/298.15 |
| 59-181622 | 10/1984 | Japan .............................. 204/298.15 |

Primary Examiner—Aaron Weisstuch
Attorney, Agent, or Firm—Oblon, Spivak, McClelland, Maier & Neustadt

[57] ABSTRACT

Disclosed is an electrostatic chucking method, comprising the steps of: (a) placing a substrate to be chucked electrostatically on a chucking material containing an electrode; (b) chucking the substrate to the chucking material by supplying a predetermined electrical potential to the electrode in the chucking material; (c) removing the substrate from the chucking material; and (d) eliminating residual charges on the chucking material by sputtering it with a plasma gas for a predetermined period. Further, the plasma gas may be capable of etching the chucking material.

4 Claims, 2 Drawing Sheets

ELECTROSTATIC CHUCKING METHOD

BACKGROUND OF THE INVENTION

1. Field of the Invention

This invention relates to an electrostatic chucking method used for fabricating a semiconductor device, and more particularly to an electrostatic chucking method capable of eliminating residual electric charges that accumulate on a chucking material (or an insulator) in an electrostatic chucking apparatus.

2. Description of the Prior Art

FIG. 1 shows mainly a cross-sectional view of an insulator used as a chucking material in an electrostatic chucking apparatus used for a conventional method of electrostatic chucking. In FIG. 1, the numeral 21 designates an electrostatic electrode which comprises a thin copper plate, and 22 denotes the insulator. The electrode 21 is embedded in the insulator 22. On the insulator 22 is placed a material such as a semiconductor substrate 23 to be chucked electrostatically by the electrostatic chucking apparatus.

The numeral 24 designates a direct current power source, 26 and 25 refer to a positive electrode and a ground negative electrode, respectively. The numeral 27 denotes a switch for switching either a positive potential or a ground potential through the electrostatic electrode.

In the electrostatic chucking apparatus having the construction described above, the switch 27 is connected to the positive electrode 26 to electrostatically chuck the semiconductor substrate 23 to the insulator 22. Thereafter, since the electrode 21 is kept at a positive potential, the semiconductor substrate 23 is chucked electrostatically so as to be firmly fixed to the insulator 22.

After a predetermined process has been carried out, when the semiconductor substrate is removed from the insulator 22, the switch 27 is switched to the grounded negative electrode 25. This enables the semiconductor substrate 23 to be removed from the insulator 22, thus completing the electrostatic chucking process.

However, there is a problem in the conventional electrostatic chucking method described above. Namely, charges on the semiconductor substrate 23 become transferred to the insulator 22 after each electrostatic chucking process, which thereby increases the amount of residual charges on the insulator 22. Consequently, when the amount of residual charges on the insulator 22 increases, the electrostatic chucking force of the insulator 22 decreases. This means that the semiconductor substrate 23 will be held to the insulator 22 by a force that gradually gets weaker and weaker.

It should be noted that in the explanation described above, the electrostatic electrode 21 is supplied with the positive potential by the direct current power source 24.

FIG. 2 shows a cross-sectional view of an insulator used as a chucking material in another conventional electrostatic chucking apparatus used for a conventional method of electrostatic chucking. In FIG. 2, two electrodes 32 and 33 are embedded in an insulator 31. The numerals 37 and 38 designate switches and 34 designates a direct current power source. The numerals 35 and 36 refer to a positive electrode and a negative electrode, respectively.

The problem mentioned hereinabove also occurs in the electrostatic chucking apparatus of FIG. 2. Namely, the residual charges are increased on the insulator 31 when the electrode 32 is supplied with a positive potential and the electrode 33 with a negative potential.

For both types of conventional electrostatic chucking apparatuses described above, this problem in the prior art cannot be resolved.

SUMMARY OF THE INVENTION

This invention is provided to overcome problems in the prior art.

An object of the present invention is to provide an electrostatic chucking method which enables residual charges on a chucking material (or an insulator) to be eliminated efficiently, so that stable electrostatic chucking of the insulator can be obtained.

According to the present invention, there is provided an electrostatic chucking method, comprising the steps of:

placing a substrate to be chucked electrostatically on a chucking material having an electrode;

chucking the substrate to the chucking material by supplying a predetermined electrical potential to the electrode in the chucking material;

removing the substrate from the chucking material; and eliminating residual charges on the chucking material by sputtering it with a plasma gas for a predetermined period.

Furthermore, in another electrostatic chucking method according to the present invention, the plasma gas used in the preceding method is capable of etching the chucking material.

Accordingly, in the present invention the chucking material, for example an insulator, is placed in the plasma gas for a predetermined period after the step of chucking the substrate on the chucking material. Thereby, the residual charges on the insulator can be eliminated by plasma gas sputtering, so that a stable electrical chucking of the insulator can be obtained.

Moreover, when a gas capable of etching the insulator is used as the plasma gas, dust generated at the surface of the insulator as well as the residual charges are eliminated by the sputtering process, so that a flat surface can be maintained for the insulator.

Furthermore, the generated dust can also be eliminated from the chamber.

It should be noted that using the electrostatic chucking method according to the present invention causes the thickness of the insulator to decrease after each sputtering step. However, the decrease of the insulator's thickness after each sputtering step can be controlled to less than 100 angstroms by optimizing the sputtering conditions, for example. Accordingly, the life of the insulator will not be reduced significantly.

These and other objects, features and advantages of the present invention will be more apparent from the following description of a preferred embodiment, taken in conjunction with the accompanying drawings.

DETAILED DESCRIPTION OF THE EMBODIMENTS

A preferred embodiment of the present invention will now be described with reference to FIG. 3.

Figure 3:
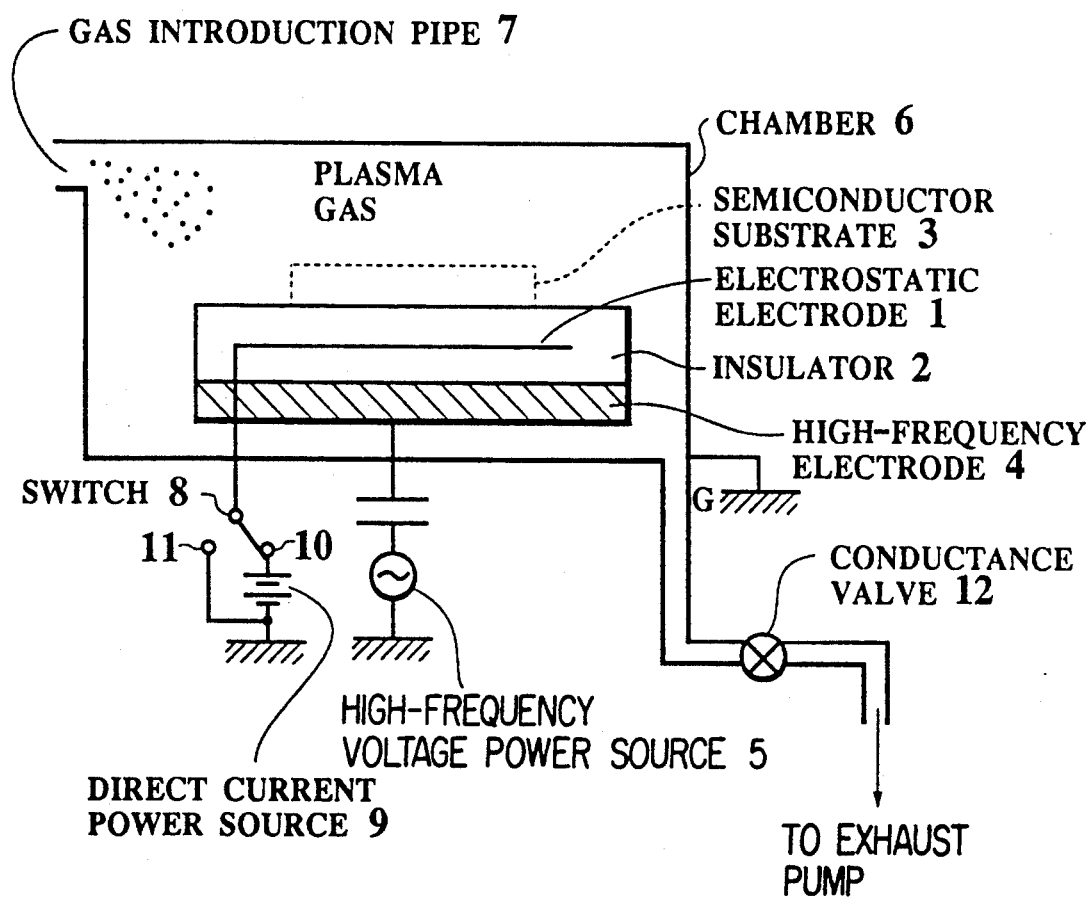
FIG. 3 is a cross-sectional view of an insulator used as a chucking material in a reactive ion-etching apparatus using an electrostatic chucking method according to the present invention.

FIG. 3 shows a cross-sectional view of an insulator used as a chucking material in an electrostatic chucking apparatus used for an electrostatic chucking method according to the present invention. In this figure, there is shown a cross-sectional view of an electrode 1, an insulator 2 as a chucking material, and a semiconductor substrate 3 to be chucked electrostatically. A high-frequency electrode 4 is connected to a high-frequency voltage power source 5 to supply a high-frequency voltage, 13.56 MHz for example, to the electrode 1. The high-frequency electrode 4 is tightly connected to the insulator 2.

Figure 1:
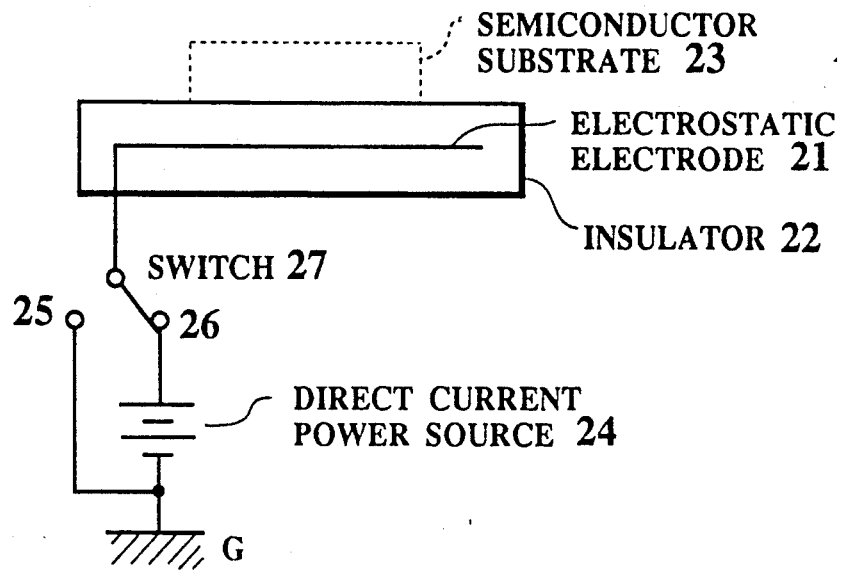
FIG. 1 is a cross-sectional view of an insulator used as a chucking material in an electrostatic chucking apparatus used for a conventional method of electrostatic chucking.
Figure 2:
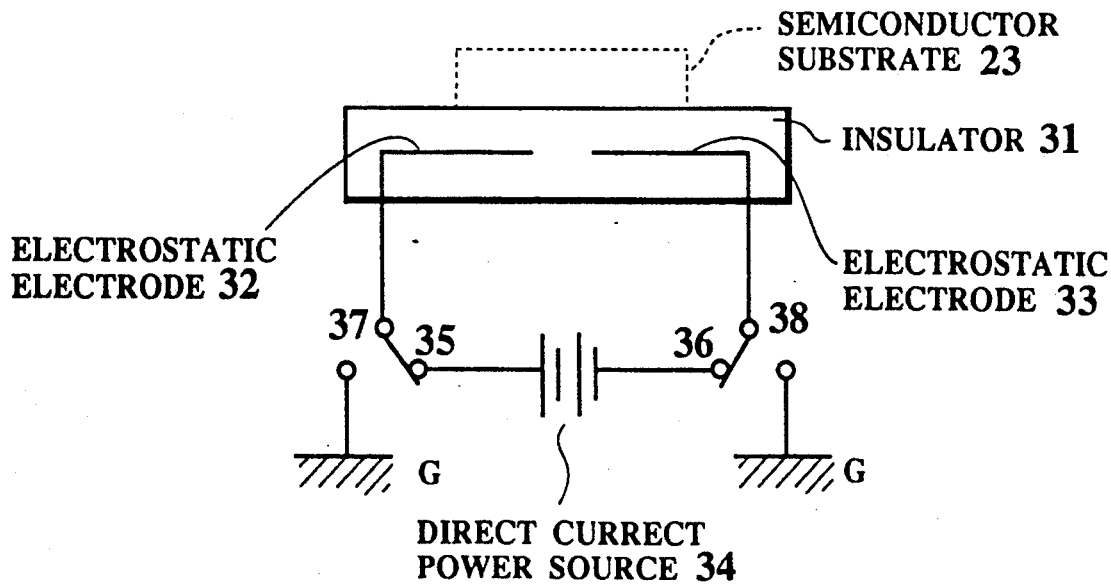
FIG. 2 is a cross-sectional view of an insulator used as a chucking material in another conventional electrostatic chucking apparatus used for a conventional method of electrostatic chucking.

Similar to the conventional electrostatic chucking apparatus shown in FIGS. 1 and 2, the electrode 1 is embedded in the insulator 2. The semiconductor substrate 3 is placed on the insulator 2; and the high-frequency electrode 4, the insulator 2, and the semiconductor substrate 3 are placed in a chamber 6. The numeral 7 designates an inlet pipe for a plasma gas used for a plasma discharging process described below. The numeral 12 designates a conductance valve to keep the chamber 6 at a predetermined pressure. The chamber 6 is grounded, and the conductance valve 12 is connected to an exhaust pump (not shown) for expelling gas from the chamber 6.

The electrode 1 is connected to a switch 8 by which the electrode 1 is connected to either a positive electrode connected to a direct current power source 9, supplying approximately 1,000 V for example, or a negative electrode 11 to supply a predetermined electric potential, e.g., ground potential (0 volt). This is similar to the method used with a conventional electrostatic chucking apparatus.

Next, the electrostatic chucking method according to the present invention will be explained in connection with the electrostatic chucking apparatus shown in FIG. 3.

First, the semiconductor substrate 6 is placed on the insulator 2.

Next, the switch 8 is switched to the positive electrode 10, whereby the semiconductor substrate 6 is chucked electrostatically to the insulator 2. With this state maintained, the semiconductor substrate is treated by predetermined processes.

Then the switch 8 is switched to the negative electrode 11 after the step is done, thus ending the chucking state by supplying ground (0 V) potential to the electrode 1.

Next, the semiconductor substrate 3 is removed from the insulator 2.

After the substrate 3 has been removed, plasma gas, for example $N_2$ gas selected from among the inert gases, is introduced through the inlet pipe 7 for a plasma etching process.

The pressure in the chamber 6 is kept at approximately 1 Pa by means of the conductance valve 12.

Next, a high-frequency voltage is supplied to the high-frequency electrode 4 from the high-frequency voltage power source 5 for thirty minutes to carry out a plasma discharge process. This causes some of the $N_2$ gas in the chamber 6 to be excited by ionization and then sputtered onto the insulator 2, thereby eliminating residual electric charges.

Finally, the plasma gas in the chamber 6 is expelled through the conduction valve by the exhaust pump, thus completing the electrostatic chucking method according to the present invention.

Almost all residual charges on the insulator 2 can be eliminated by the electrostatic chucking method according to the present invention in order to maintain a predetermined stable chucking force.

Next, another embodiment of an electrostatic chucking method according to the present invention will be described below.

As it is possible for the surface of the insulator 2 to become roughened by the sputtering action of the $N_2$ plasma gas, dust generated on the surface of the insulator 2 by the sputtering process can have adverse effects on the semiconductor fabricating process. For that reason, in the second embodiment, a gas capable of etching the surface of the insulator 2 is used as a plasma gas to overcome such problems.

For example, if a halogen containing, e.g., fluorine gas, is used as the plasma gas when the insulator 2 is a quartz material, almost all the dust generated from the insulator and the residual charges on the surface of the insulator 2 can be eliminated. Moreover, the surface of the insulator 2 can be kept flat by the etching.

In the conventional electrostatic chucking method in the prior art, the semiconductor substrate is held to the insulator by a force of approximately 100 grams/weight after the electrostatic chucking process has been carried out twenty times. On the other hand, by the electrostatic chucking method of the present invention, the semiconductor substrate is held by a force substantially larger than 1,000 grams/weight even after the electrostatic chucking process have been carried out more than 1000 times.

Thus, a stable chucking force on the insulator can be obtained by using the electrostatic chucking method according to the present invention.

It should be mentioned that it is not necessary to carry out the steps of eliminating the residual charges for every electrostatic chucking step. Instead, the residual charge eliminating step can be carried out whenever the amount of residual charge exceeds a predetermined level.

In the embodiments according to the present invention, the plasma gas is described as an $N_2$ gas, the chucking material as an insulator, and the material to be chucked as semiconductor substrate. However, the present invention is not to be limited in view of the embodiment described above.

Furthermore, the frequency of the high-frequency voltage power source can be freely determined in accordance with the volume of the chamber, and the type of insulator.

Finally, various modifications are possible without departing from the scope of the present invention as defined in the appended claims.

What is claimed is:

1. An electrostatic chucking method, comprising the steps of:
  (a) placing a substrate to be chucked electrostatically on a chucking material containing an electrode therein;

(b) chucking the substrate to the chucking material by supplying a predetermined electrical potential to the electrode in the chucking material;
(c) removing the substrate from the chucking material; and
(d) eliminating residual charges on the chucking material by sputtering it with a plasma gas for a predetermined period.

2. An electrostatic chucking method according to claim 1, wherein the chucking material is an insulator, and the plasma gas is $N_2$ gas.

3. An electrostatic chucking method, comprising the steps of:

(a) placing a substrate to be chucked on a chucking material containing an electrode therein;
(b) chucking the substrate to the chucking material by supplying a predetermined electrical potential to the electrode in the chucking material;
(c) removing the substrate from the chucking material; and
(d) eliminating residual charges on the chucking material by sputtering it for a predetermined period with a plasma gas which is capable of etching the chucking material.

4. An electrostatic chucking method according to claim 3, wherein the chucking material is an insulator, and the plasma gas is a halogen containing gas.

* * * * *